United States Patent

Ho et al.

[11] Patent Number: 5,847,569
[45] Date of Patent: Dec. 8, 1998

[54] ELECTRICAL CONTACT PROBE FOR SAMPLING HIGH FREQUENCY ELECTRICAL SIGNALS

[75] Inventors: Francis Ho, Palo Alto; David M. Bloom, Portola Valley, both of Calif.

[73] Assignee: The Board of Trustees of the Leland Stanford Junior University, Stanford, Calif.

[21] Appl. No.: 694,925

[22] Filed: Aug. 8, 1996

[51] Int. Cl.$^6$ .................................................. G01R 31/28

[52] U.S. Cl. .......................................... 324/752; 324/754

[58] Field of Search ............................... 324/73.1, 158.1, 324/750, 751, 752, 676, 754; 73/105; 250/306, 307

[56] References Cited

U.S. PATENT DOCUMENTS

| | | | |
|---|---|---|---|
| 3,720,818 | 3/1973 | Spragg et al. | 73/105 |
| 5,267,471 | 12/1993 | Abraham et al. | 250/306 |
| 5,321,977 | 6/1994 | Clabes et al. | 73/105 |
| 5,381,101 | 1/1995 | Bloom et al. | 324/676 |
| 5,406,832 | 4/1995 | Gamble et al. | 250/307 |
| 5,442,300 | 8/1995 | Nees et al. | 324/762 |

OTHER PUBLICATIONS

J. Nees et al., *Picosencond Detector, Optical Temporal Analyzer, and Free–Standing Circuit probe* /OSA Proc. on Ultafast electronics and Optoelectronics 1993, vol. 14, pp. 186–188. (unvaailable month).

J.A. Nees et al., *Integrated atomic force microscope and ultrafast sampling probe*, Ultrafast Phenomena, 1994 Technical Digest Series, vol. 7, pp. 307–309. Optical Society of America (unavilable month).

*Primary Examiner*—Vinh P. Nguyen
*Attorney, Agent, or Firm*—Lumen Intellectual Property Services

[57] ABSTRACT

An all-electrical high frequency contact sampling probe provides sub-micron spatial resolution and picosecond or sub-picosecond temporal resolution. In a preferred embodiment, the probe is a monolithic integration of a sampling circuit with a cantilever and probe tip, where the distance between the circuit and the tip is less than a wavelength of interest in an RF signal [$V_{RF}$]. The sampling circuit [44] uses Schottky diodes [SD] for sampling the RF signal [$V_{RF}$] from a device under test at a rate determined by local oscillator signals [50, 52]. An IF signal [$V_{IF}$] produced by the sampling probe is an equivalent time representation of the RF signal. Applications include testing signals at interior nodes of high speed integrated circuits.

9 Claims, 9 Drawing Sheets

ELECTRICAL CONTACT PROBE FOR SAMPLING HIGH FREQUENCY ELECTRICAL SIGNALS

This invention was supported in part by ONR/ARPA grant number 2WMN769. The Government has certain rights in the invention.

FIELD OF THE INVENTION

This invention relates generally to electrical probes. More particularly, it relates to electrical sampling probes having picosecond and sub-picosecond temporal resolution and sub-micron spatial resolution.

BACKGROUND OF THE INVENTION

Advances in integrated electronic circuit technology have led to a need for electrical sampling probes with increased spatial and temporal resolution. In particular, there is a need for electrical samplers with sub-micron spatial resolution and picosecond or sub-picosecond temporal resolution for testing interior nodes of state-of-the-art integrated circuits.

The use of stroboscopic electrical samplers to measure periodic signals has a long history. FIG. 1 is a simplified schematic diagram of how a sampler operates. Voltage $V_{RF}$ is a periodic signal (shown in FIG. 2), with repetition rate f, that one wishes to measure. A sampling switch 20 (usually a Schottky diode) is cycled at a rate of f-$\Delta$f by a local oscillator (LO) 22. Sampling switch 20 is closed (contact made) for a brief time, $\Delta$t, during each cycle, and opened (contact broken) for the remainder of the time under the control of the LO signal (shown in FIG. 3). A hold capacitor 24 charges a small amount towards $V_{RF}$ during each switch closing, so that if $\Delta$f=0, $V_{RF}$ and the sampling switch would be synchronized, and the hold capacitor would eventually charge to the value of $V_{RF}$ at the switch-closing times. When $\Delta$f is nonzero, as is usually the case, then an intermediate frequency signal $V_{IF}$ (the voltage across the capacitor) is a slowed-down, or "equivalent-time," representation of $V_{RF}$, as shown in FIG. 4. Alternatively, if $\Delta$f=0 then the voltage on the hold capacitor depends on the phase relationship between $V_{RF}$ and $V_{LO}$ so that $V_{RF}$ can be measured by varying the phase gradually.

Since the purpose of using equivalent-time samplers is to measure signals that are otherwise too fast to be measured, the most important attribute of a sampler is the temporal resolution, or measurement bandwidth. Over the years, temporal resolutions have been improved through innovations such as optimizing circuit layout for low parasitics and monolithic integration.

We are seeking, however, a voltage measurement technique that combines good temporal resolution with good spatial resolution as well. The high-speed samplers to date take their input signal from an incoming transmission line, to which the samplers present a 50 $\Omega$ load termination. Measurement through an input transmission line clearly precludes sub-micron spatial resolution. In addition, the 50 $\Omega$ load impedance of these samplers make them far from noninvasive. In short, these samplers can only be used on output ports of circuits, and cannot be used to probe internal nodes of circuits.

One might think that sub-micron spatial resolution can be achieved by simply using a sharp tip to couple the electrical sampler to a circuit. For example, one could connect an atomic force microscope (AFM) to a sampler by coaxial cable, with the center conductor connected to the AFM tip and the ground conductor connected to a ground on the device under test (DUT). The distributed shunt capacitance of the cable, however, will react on the signal from the DUT in a highly frequency-dependent manner, resulting in a horrible frequency response. In other words, the multiple reflections within the coaxial cable prevent the obvious combination of an AFM with a sampler from operating in a useful manner.

The above problem was avoided by a device disclosed by Nees et al. in U.S. Pat. No. 5,442,300, which is incorporated herein by reference. By positioning an integrated photoconductive sampling switch very close to the AFM tip (FIG. 5), Nees et al. avoided the problems caused by reflections within the coaxial cable and demonstrated a point-contact photoconductive sampler with 2.5 ps temporal resolution. The device of Nees et al., however, is limited in several respects by its use of photoconductive switches that are activated by laser pulses. The temporal response of photoconductors has a theoretical limit in the picosecond range, thus precluding further increases in speed. Moreover, pulsed diode lasers also have a pulse-width threshold in the picosecond range, and may also have insufficient pulse energy to effectively activate the photoconductive switch. Mode-locked lasers have a fixed pulse length and limit the versatility of the sampler. Scattered laser light may interfere with the DUT, introducing errors in the measurement. Perhaps most importantly, the use of lasers introduces additional cost and complexity to the device of Nees et al. In addition, the device is fragile due to the difficulty in maintaining precise alignment of the lasers.

Significantly, the teaching of Nees et al. does not provide a theoretical understanding of the operation of the device. In particular, Nees et al. do not explain why the remaining parasitic inductance in the external ground connection, in conjunction with the sampling-hold capacitor, does not form a resonant circuit that distorts the frequency response of the device. Indeed, as explained in detail below, it appears at first sight that the device of Nees should not operate at all.

FIG. 5 is a conceptual drawing of a scanning electrical sampler similar to that of Nees. An AFM tip 26 is placed in close electrical proximity to a sampler 28. A circuit signal $V_{RF}$ is sampled by a switch 30 controlled by a laser 32. A second laser 34 is used for determining the position of the AFM tip. An equivalent time signal $V_{IF}$ is a slowed-down representation of the circuit signal $V_{RF}$.

Although the use of the AFM provides good spatial resolution, the temporal resolution presents an additional difficulty. This can be seen by examining the block diagram of a generalized sampling probing setup, shown in FIG. 6. (The term "probing" indicates good spatial resolution.) For a conventional electrical sampler (e.g., a commercial sampling oscilloscope), the electrical coupling between the probe and the DUT consists of a high-speed transmission line. Here, however, the fact that this is a "probing" setup means that the electrical coupling between the probe and the DUT must consist of a single-point contact 36 at the location being probed, and an additional ground connection 38. The DUT has a signal, $V_{RF}$, that needs to be dropped across the sampling nonlinearity, or sampler 40, in order for the sampled output $V_{IF}$ to appear. The DUT and the sampler are connected through the DUT-to-sampler connection 36 and the nature of this coupling determines the spatial resolution. The external ground connection 38 is needed to connect the ground of the DUT with the ground of the sampler. The sampler is therefore in series with the DUT-to-sampler connection and the external ground connection.

The details of the circuit are shown in FIG. 7. For practical reasons, it is not possible to make $C_h$ small in capacitance compared to $C_g$. Therefore, a direct connection must be made between the grounds of the probe and the DUT, and this connection will have an associated parasitic inductance, L. Using minimum values for $C_h$ and L that are reasonably attainable, $C_h$=10 fF and L=50 nH, the natural resonance frequency is $f_0$=7 GHz, so that signals above 7 GHz would be mostly dropped across L. This appears to indicate that the parasitic ground inductance limits the high-frequency operation of such a sampler.

In summary, because the device of Nees et al. does not have a good high-frequency ground, there is no clear basis for its proper operation. Moreover, without a theoretical understanding of the principles by which such samplers operate, there is no foundation for the development of extensions or variations upon their device. Consequently, the prior art does not contain any contact samplers with high spatial and temporal resolution except for the device of Nees et al. which is unnecessarily fragile, expensive, and complex.

OBJECTS AND ADVANTAGES OF THE INVENTION

Accordingly, it is a primary object of the present invention to provide an improved electrical sampling probe with high spatial and temporal resolution. In particular, it is an object of the present invention to provide such a probe that is inexpensive, robust, and versatile, is entirely electrical, and can be integrated entirely on a single chip. Other objects and advantages will be apparent from the following description and figures.

SUMMARY OF THE INVENTION

Surprisingly, the present inventors have discovered that it is theoretically possible to provide an entirely electrical sampling probe with sub-picosecond temporal resolution and sub-micron spatial resolution. In addition to providing the theoretical understanding which makes such a device possible, the present disclosure teaches how to make and use such an all-electrical sampling probe that is advantageously integrated onto a single circuit. A preferred embodiment of the device is constructed using standard microfabrication techniques and integrated circuit technology.

The present probe is capable of sampling a high frequency electrical signal within an electronic circuit, where the high frequency signal contains a wavelength λ corresponding to a highest frequency component of interest. In a preferred embodiment of the invention, the wavelength λ of interest, and hence the distance between the switch and the probe tip, is on the order of a few millimeters or less. The probe includes an electrically conductive probe tip adapted for coupling to the electrical signal, an electrically-controlled sampling switch in electrical communication with the tip and positioned within a distance from the tip that is small compared to the wavelength λ, e.g. a distance λ/10 or smaller will allow the signal component of interest to be faithfully measured, while larger distances will reduce the reliability of the measurement. The probe also includes a local oscillator in electrical communication with the sampling switch. The local oscillator generates an electrical control signal that selects one of two states of the switch. In a preferred embodiment of the invention, the switch is implemented using a Schottky diode. A first state of the switch permits the electrical signal to pass through the switch, wherein a second state of the switch does not permit the electrical signal to pass through the switch.

DETAILED DESCRIPTION

In view of the clear advantages that an all-electrical sub-picosecond sub-micron probe enjoys, it could not have been obvious to skilled artisans such as Nees how to construct such a probe. Moreover, in view of the prior lack of theoretical understanding of the Nees probe, it would not have been obvious that such an all-electrical probe is even possible. The following description, on the other hand, provides a theoretical basis for the operation of an entire class of high speed electrical sampling probes, including the probe of Nees et al. In particular, a basis is now provided for constructing an all-electrical probe with its numerous advantages over the photoconductive-switched probe of Nees et al. As explained in detail below, the most important conclusion that can be drawn from the present theory of the contact electrical sampler, applicable to both the photoconductive sampler of Nees et al. and the present electrical sampler, is that the temporal resolution of a point-contact electrical sampler is fundamentally limited only by the speeds of the sampling switches and the sampling pulses, and not by the parasitic ground inductance L.

Figure 1:
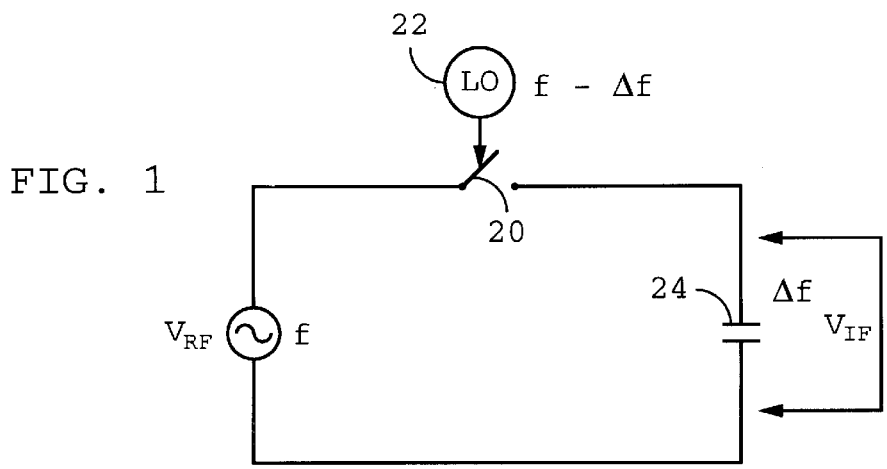
FIG. 1 is a simplified schematic diagram of how a standard sampler operates.
Figure 2:
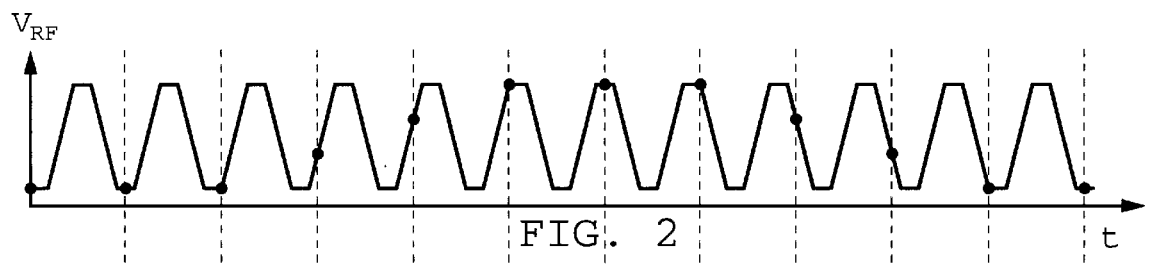
FIG. 2 is a graph of an RF signal of frequency f.
Figure 3:
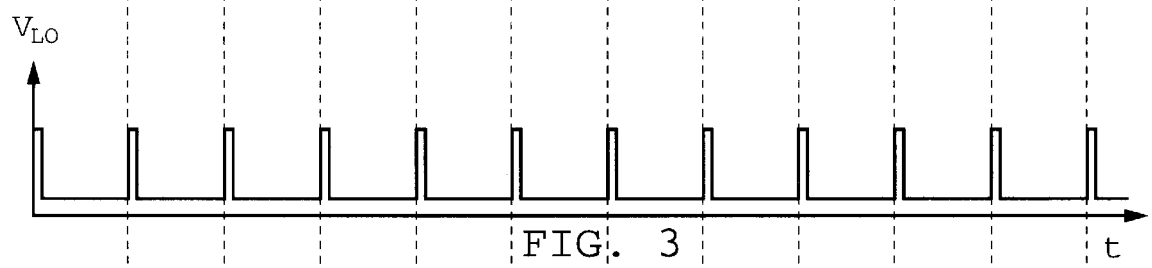
FIG. 3 is a graph of a sampling switch (LO) signal.
Figure 4:
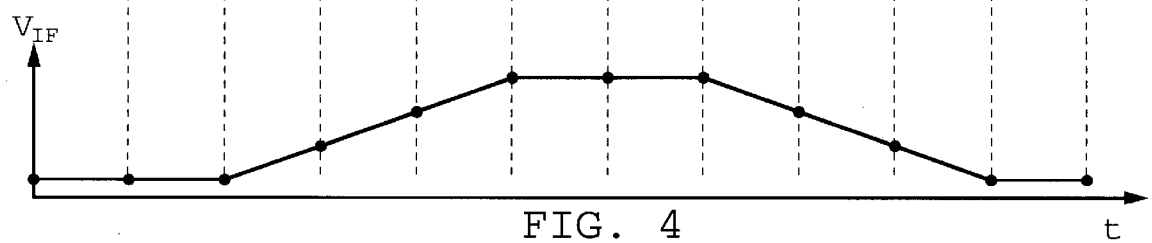
FIG. 4 is a graph of an equivalent time signal of the RF signal shown in FIG. 2.
Figure 5:
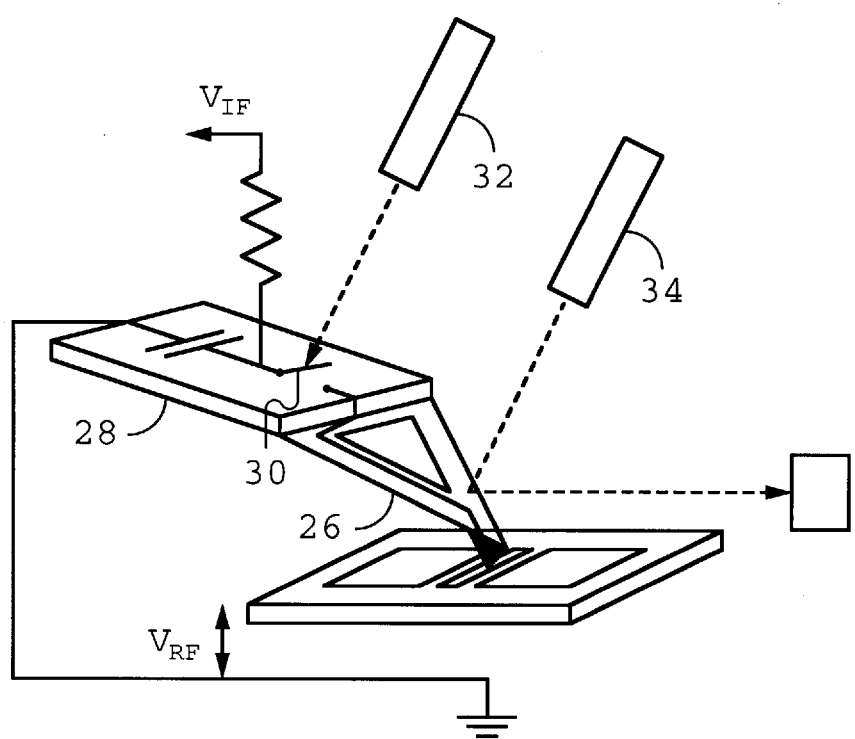
FIG. 5 is a hypothetical sampling probe.
Figure 6:
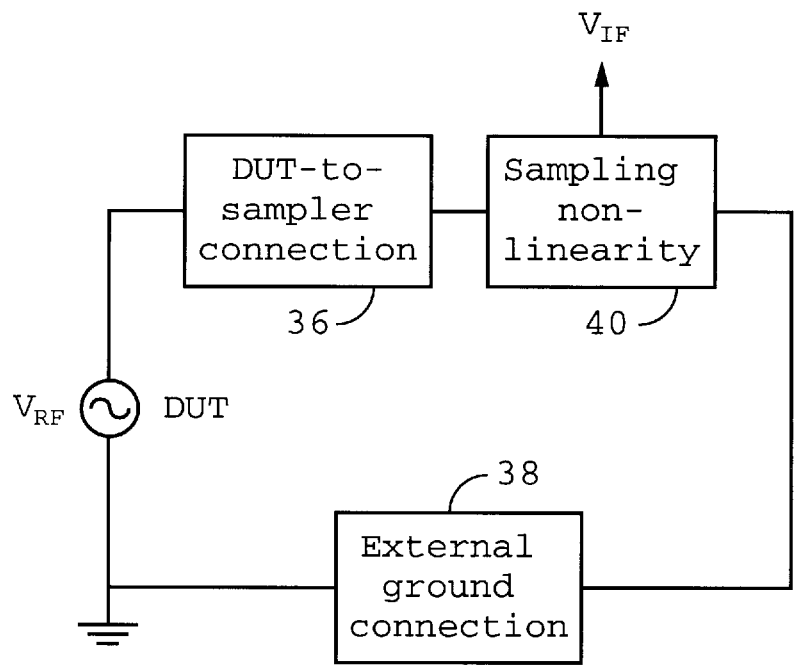
FIG. 6 is a block diagram of a generalized sampling probe setup.
Figure 7:
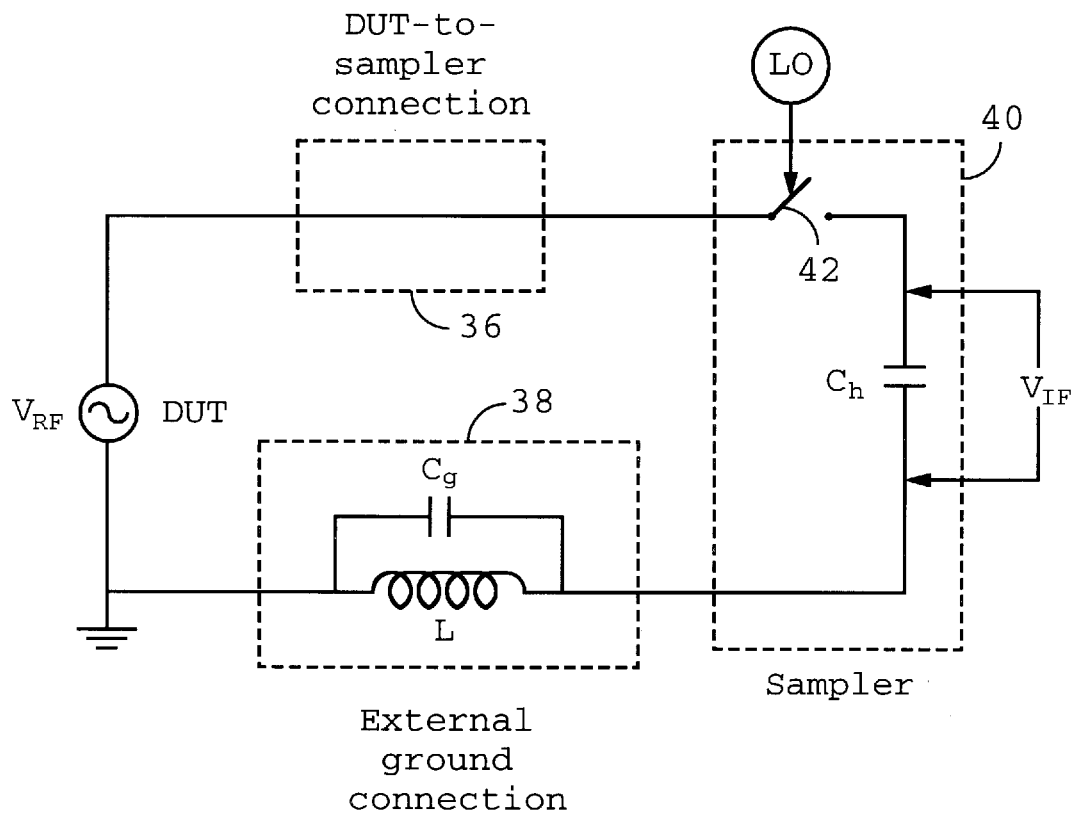
FIG. 7 is a schematic showing details of the diagram of FIG. 6.

A sampler has as its input a high-frequency RF signal $V_{RF}$, containing a frequency f of interest, and as its output a low-frequency IF signal $V_{IF}$, as shown in the idealized circuit of FIG. 7. The IF signal is an equivalent-time signal; that is, to obtain the correct temporal measurement, one multiplies the time scale of the IF signal by the factor Δf/f, which is the ratio of an offset frequency to the RF frequency. Thus, to compare the IF output to the RF input, we simply convert the IF signal into equivalent-time. (Alternatively, Δf could be zero and the phase could be gradually changed, as mentioned earlier.) In the best of all possible worlds, the IF signal would always be an exact replica of the RF signal. In the real world, unfortunately, the IF signal decreases as the IF frequency is increased. The IF response, $h_{IF}(\Delta f) = V_{IF}(\Delta f)/V_{IF}(0)$, characterizes how the IF signal amplitude depends on the IF frequency, and may be measured by applying a fixed frequency sine wave to the RF port and observing the variation of the IF signal as the IF frequency $\Delta f$ is increased. From the IF response, by analogy to transfer functions for RC filters, we can calculate the IF bandwidth (the IF frequency at which the IF response falls to a certain value) and the IF rise time (the real-time rise time of the IF signal, with a perfect step applied to the RF port).

Although it appears from a frequency-domain analysis that a parasitic ground inductance prevents one from faithfully measuring signal frequencies higher than a certain cutoff frequency, such a simple frequency-domain analysis is only valid for circuits with time-invariant elements. The sampling switch, however, is clearly a time-varying element. In fact, parasitic ground inductances affect not the temporal resolution, but rather the IF bandwidth.

Each time the switch 42 is closed, the capacitor $C_h$ will charge a certain fractional amount towards the value of $V_{RF}$ at that instant. Suppose that $\Delta f=0$, so that $V_{RF}$ has the same value, $V_0$, each time the sampling switch is closed. It is then clear that $C_h$ will eventually charge up to $V_0$ if we wait long enough, regardless of what the parasitic inductance L, or series resistance, is (provided leakage currents can be neglected). If the parasitic inductance L were made larger, then the charging fraction per switch cycle would become smaller, which simply means that $C_h$ would take longer to charge to $V_0$ to within a specified tolerance. Once one is satisfied with that measurement, one can delay the LO switch closings by a small time step, so that the next data point from $V_{RF}$ can be taken. In other words, if one started with a perfect ground connection (zero inductance), and was able to achieve a certain temporal resolution, then even if parasitic inductances were added, one would still be able to measure with the same temporal resolution, although one would be forced to use a lower IF frequency (i.e., the IF bandwidth would be reduced).

Figure 8:
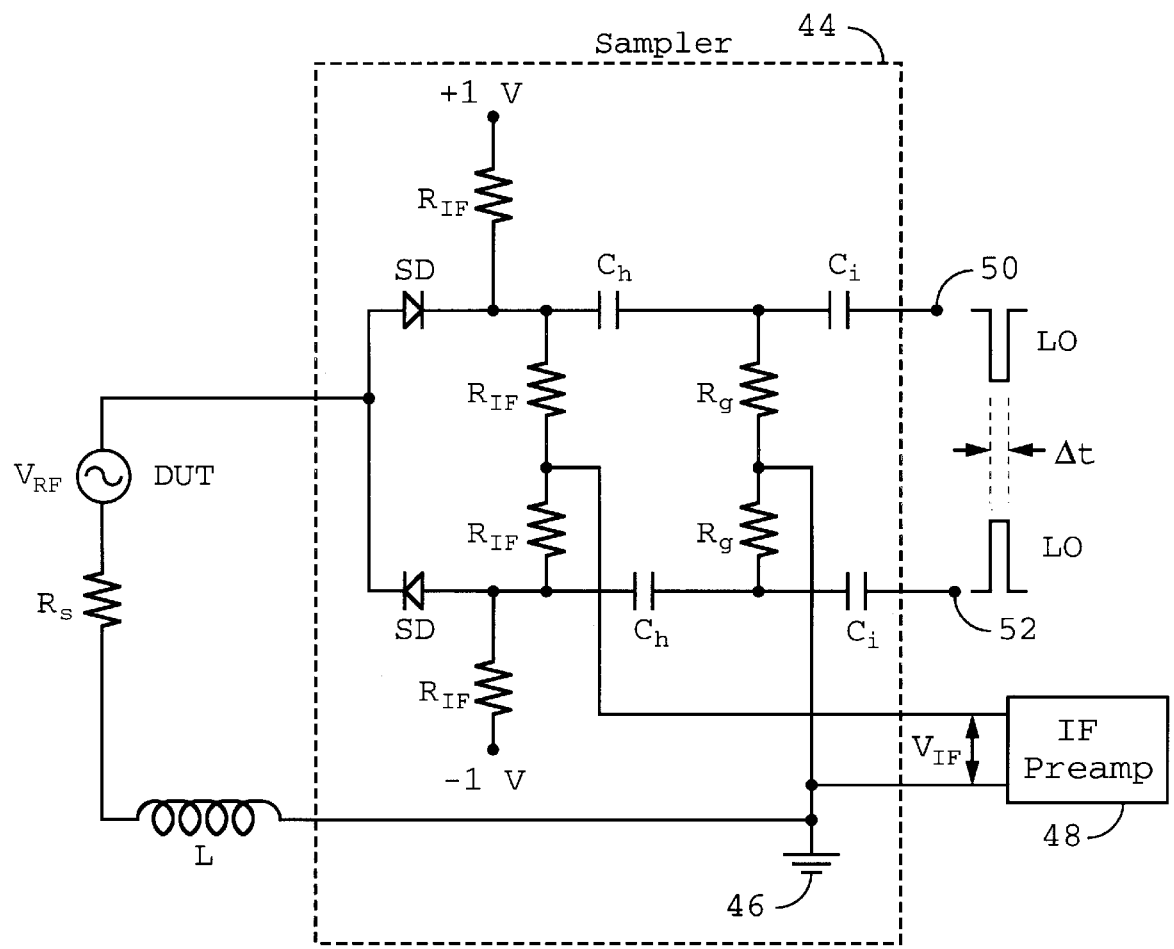
FIG. 8 is a schematic diagram of a sampler according to the invention.

A preferred embodiment of a scanning electrical sampler according to the present invention is constructed by microelectronics techniques which are well known in the art. FIG. 8 is a schematic diagram of a circuit containing a scanning electrical sampler 44 and its connections while in operation. Schottky diodes SD are used as the preferred sampling switches. Capacitors $C_h$ are hold capacitors that charge up to the DUT voltage, $V_{RF}$, when the diodes are conducting. The DUT has output impedance $R_s$, and its ground is connected to the ground 46 of the sampler through a connection that has parasitic inductance L. Resistors $R_{IF}$ provide dc bias for the diodes, and also couple the hold capacitors to an IF preamplifier 48. Resistors $R_g$ couple the hold capacitors to ground 46. Input coupling capacitors $C_i$ serve to ac-couple the sampler circuit 44 to the LO pulse inputs 50 and 52. The LO pulses, which can be supplied, for example, by step-recovery diodes (not shown), are 136 ps in pulse width and 4.8 V in amplitude. LO pulse 50 is a negative-going pulse, while pulse 52 is a positive-going pulse, and the two are synchronized. IF preamplifier 48 is a low-noise, high-impedance amplifier. Table 1 lists the component specifications; the design is for an RF fundamental frequency, f=100 MHz, and an IF frequency, $\Delta f=7$ Hz. Anyone skilled in the art will appreciate that these particular specifications are only particular choices, and that many other specifications may be chosen depending on the desired application. In addition, anyone skilled in the art will also recognize that this circuit may be altered in various ways to give similar or equivalent results.

TABLE 1

| | |
|---|---|
| $R_g$ | 510 Ω |
| $R_{IF}$ | 2.2 MΩ |
| $C_h$ | 1 pF |
| $C_i$ | 1 nF |
| L | ≈ 10 nH |
| Preamp input resistance | 100 MΩ |
| Preamp input capacitance | 25 pF |
| Preamp input cable capacitance | 200 pF |

Circuit specifications for scanning electrical sampler.

Functionally, the circuit of FIG. 8 can be divided into an LO section, an RF section, and an IF section.

The LO pulse generators are 50 Ω sources, and $C_i$ presents an impedance of 1.6 Ω at the LO fundamental of 100 MHz. Therefore, the presence of the $R_g$ resistors can be neglected for the analysis of the LO circuit. The dc biases serve to mask out small ripples on the LO input, and are summed with the LO pulses to produce pulses at the diodes that are further thresholded by the self-biasing effects of the diodes. (The diodes will sustain maximum forward biases of approximately 0.7 V, relatively independent of the applied LO pulse amplitude, because of the exponential I-V characteristic of diode conduction.) The end result is that the sampling diodes are made conducting, with on-resistances of approximately a few hundred ohms, for a duration of approximately 140 ps during each 10 ns period of the LO; these intervals during which the diodes are "on" are known as sampling intervals.

RF Section

Figure 9:
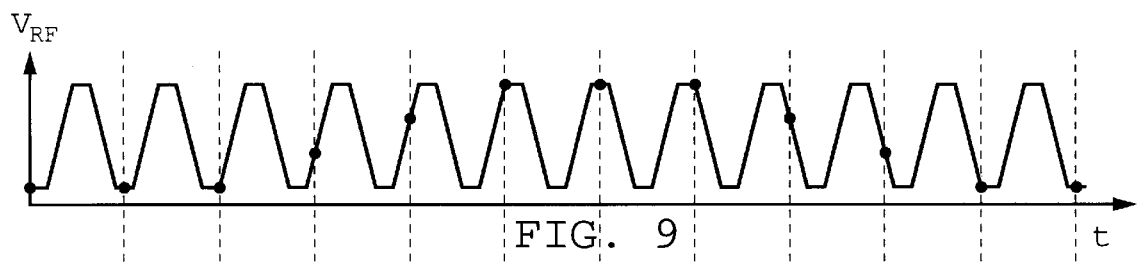
FIG. 9 is a graph of an RF signal to be sampled.
Figure 10:
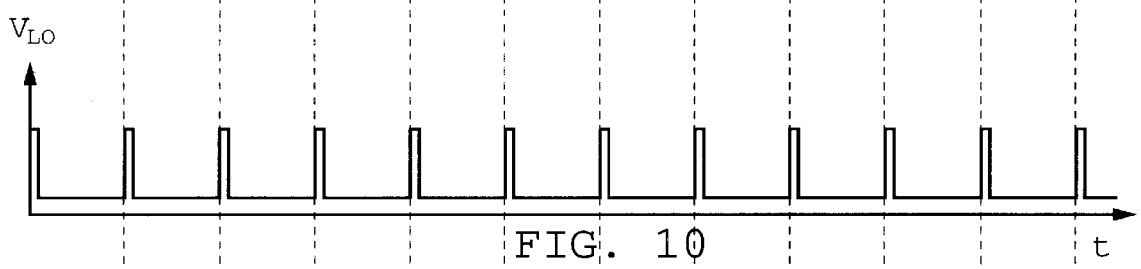
FIG. 10 is a graph of a local oscillator signal used to control sampling.
Figure 11:
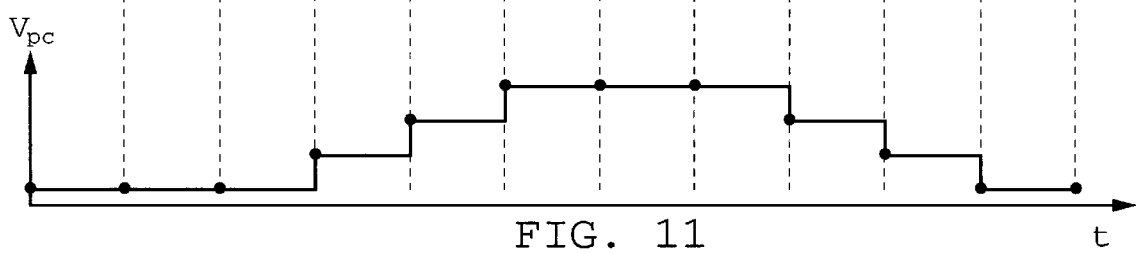
FIG. 11 is a graph of a piecewise constant voltage giving an equivalent time IF signal of the RF signal of FIG. 9.

To facilitate the analysis of the sampling action, it is useful to define a piecewise constant voltage $V_{pc}$ (graphed in FIG. 11), which is a voltage that has the same value as $V_{RF}$ (graphed in FIG. 9) at the start of each interval of the sampling pulses (graphed in FIG. 10), and remains constant between successive sampling intervals. The piecewise constant voltage, therefore, changes values only at the start of each sampling interval; this is, of course, just equivalent-time sampling restated in a modified form. If we can assume that the sampling intervals are sufficiently short, so that $V_{RF}$ can be considered to remain constant during each sampling interval, then $V_{RF}$ can be replaced by $V_{pc}$ for the analysis of the RF section, since the piecewise constant signal and the real RF signal are only different during the times when the sampling switch is open, precisely the moments when the rest of the sampler cannot have any information of the state of the RF signal. Furthermore, $V_{pc}$ will be a faithful equivalent-time representation of $V_{RF}$ if the sampling intervals are short enough and the offset frequency $\Delta f$ is small enough (sampling points close enough in phase). The first condition turns out to be far more limiting in practice, so that the temporal resolution of the RF section is roughly equal to the length of the sampling interval. The exact expression for the bandwidth depends on the form of the sampling interval, which is in reality a conduction pulse in the sampling diodes; an approximate 3-dB bandwidth is given by $$B_{RF} \approx \frac{0.35}{t_1}.$$

The value of $t_1$ depends on both the LO sampling pulse width and the sampling diode switching speed.

Figure 12:
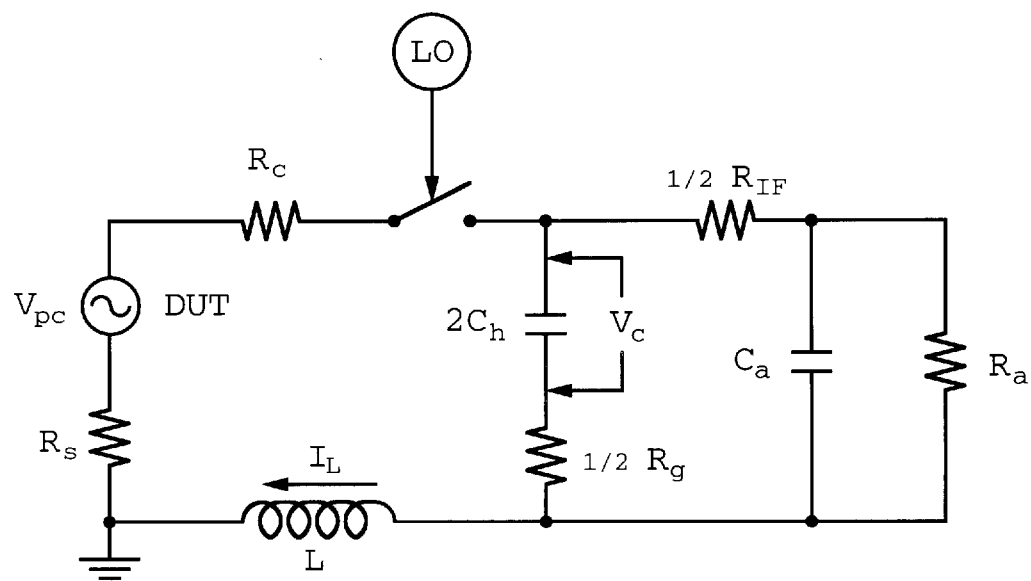
FIG. 12 is an equivalent circuit for an RF section of the probe.

The equivalent circuit for the RF section is shown in FIG. 12. $R_c$ represents the series resistance of the DUT-to-sampler coupling, which includes the contact resistance (contact between the probe tip and the DUT) and the sampling diode series "on" resistance, and is on the order of a few hundred ohms. $R_a$ is the input resistance of the preamp, 100 MΩ, and $C_a$ is the loading capacitance presented by the preamp connection, 225 pF, which includes both the preamp input capacitance and the capacitance of the connecting cable. During each sampling interval, the voltage on the hold capacitors, $V_c$, will charge towards the value of $V_{pc}$. The net voltage contributed by the LO pulses to $V_c$ is zero, since the two pulses are complementary in voltage. Let $t_1$ be the length of the sampling interval (width of the sampling pulse), $t_2=1/f$ be the period of the LO, and t=0 be the time of the start of the sampling interval. To simplify the analysis, we will only consider two regimes: in the first regime, the effect of L dominates, and in the second regime, the effect of $R_c$ and $R_g$ dominates.

If L is large, the entire value of $V_{pc}-V_c$ is dropped across L. The rate of change of the current, I, through the inductor is $$\frac{dI}{dt} = \frac{V_{pc} - V_c}{L}.$$

Therefore, assuming that $V_c$ remains roughly constant during the time $t_1$, $$I(t) \approx \frac{V_{pc} - V_c}{L} t.$$

At the end of the sampling interval, we therefore have $$\Delta V_{c,+,L} = V_c(t_1) - V_c(0)$$

$$= \frac{1}{2C_h} \int_0^{t_1} I \, dt$$

$$\approx \frac{V_{pc} - V_c}{4LC_h} t_1^2.$$

The approximation that $V_c$ remains roughly constant is therefore valid when $$\frac{t_1^2}{4LC_h} \ll 1.$$

If the resistances dominate the behavior, the current is $$I = \frac{V_{pc} - V_c}{R}$$

$$= 2C_h \frac{dV_c}{dt},$$

where $R = R_s + R_c + R_g/2$. If $$t_1 \ll 2(R_s + R_c + R_g/2)C_h,$$

then $V_c$ can be treated as roughly constant, and we therefore have $$\Delta V_{c,+,R} = \frac{V_{pc} - V_c}{2RC_h} t_1.$$

We see, therefore, that the regime with L dominant is valid when $\Delta V_{c,+,L} \ll \Delta V_{c,+,R}$. The criteria are therefore $$\frac{t_1^2}{4LC_h} \ll 1$$

and $$\frac{\left(R_s + R_c + \frac{1}{2} R_g\right) t_1}{2L} \ll 1.$$

Similarly, the criteria for the regime with R dominant are $$t_1 \ll 2(R_s + R_c + R_g/2)C_h$$

and $$\frac{\left(R_s + R_c + \frac{1}{2} R_g\right) t_1}{2L} \gg 1.$$

Looking at our values of $t_1 \approx 10^{-10}$, $L \approx 10^{-8}$, $C_h \approx 10^{-12}$, and $R_s + R_c + \frac{1}{2}R_g \approx 10^3$, we see that we are in the resistance-limited regime.

At the end of the sampling interval, the diodes are turned off, and remain off until the start of the next sampling interval, at time $t=t_2$. During the entire time, the IF coupling resistance $\frac{1}{2}R_{IF}$ acts as a leakage path through which the hold capacitors can discharge. The change in voltage due to this leakage over time interval $t_2$ has a value of $$\Delta V_{c,-} = -\frac{1}{2C_h} t_2 \frac{V_c}{\frac{1}{2} R_{IF}}$$

$$= -\frac{V_c t_2}{R_{IF} C_h}.$$

Therefore, if the IF frequency is sufficiently low that $V_c$ is allowed to reach a steady state value, the fractional discrepancy between $V_c$ and $V_{pc}$ will be determined by $$\Delta V_{c,-} = \Delta V_{c,+}.$$

In the inductance-limited regime, we have $$\frac{V_{pc} - V_c}{V_c} = \frac{4}{D} \frac{L/t_1}{R_{IF}},$$

where $D=t_1/t_2$ is the sampling pulse duty cycle. ($1/t_1$ can be thought of as the characteristic frequency of the "on" portion of sampling, so that $L/t_1$ is the impedance of L at that frequency.) In the resistance-limited regime, we have $$\frac{V_{pc} - V_c}{V_c} = \frac{2}{D} \frac{R_s + R_c + R_g/2}{R_{IF}}.$$

For our circuit values, in the resistance-limited regime, we have $$\frac{V_{pc} - V_c}{V_c} \approx 0.1,$$

which means that our measured voltage and the actual voltage will be within 10%, and that the leakage effect is a small one.

The conclusion drawn from this analysis of the RF section is therefore that for our circuit values, at the end of each period $t_2$ of the LO, neglecting leakage, the value of $V_c$ has changed by the quantity $$\Delta V_{c,+} = (V_{pc} - V_c(0)) \frac{t_1}{2(R_s + R_c + R_g/2)C_h}.$$

The sampling efficiency, $\eta$, is defined as $$\eta = \frac{\Delta V_{c,+}}{V_{pc} - V_c(0)}$$

$$= \frac{t_1}{2(R_s + R_c + R_g/2)C_h}.$$

The dynamics of this process is that of a single-pole RC low-pass filter, with the time constant of $$\tau_0 = \frac{t_2}{\eta}$$

$$= 2(R_s + R_c + R_g/2) C_h/D.$$

It takes $1/\eta$ periods of charging to make a $1/e$ change, and each period has duration $t_2$. The final expression for $\tau_0$ can also be thought of as the charging time of the hold capacitors through an impedance of $R_s+R_c+R_g/2$, divided by the duty cycle.

IF Section

Figure 13:
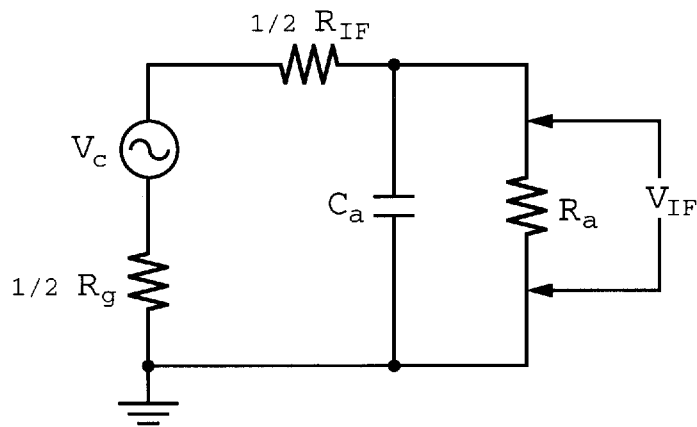
FIG. 13 is an equivalent circuit for an IF section of the probe.

FIG. 13 shows the equivalent circuit for the IF section. The voltage on the hold capacitors of the RF section, $V_c$, is represented here as a voltage source. The other components are the same as in FIG. 12. $V_{IF}$, the voltage on $R_a$, is the IF voltage that is read out. We can neglect $R_g$, since $R_g \ll R_{IF}$. We can also neglect $R_a$, since $R_a \gg R_{IF}$. Thus, we again obtain a low-pass filter, this time with time constant $$\tau_a = \frac{1}{2} R_{IF} C_a.$$

The $V_{pc}$ to $V_{IF}$ transfer function is therefore $$h_{IF}(f_{IF}) = \frac{1}{(1 + i2\pi f_{IF} \tau_0)(1 + i2\pi f_{IF} \tau_a)}.$$

The IF region where there is minimum distortion, or $h_{IF} \approx 1$, is therefore $$0 \leq f_{IF} < \frac{1}{2\pi \tau_{IF}},$$

where $\tau_{IF}$, the effective IF time constant, is given by $$\tau_{IF} = \max(\tau_0, \tau_a),$$

assuming that the values of $\tau_0$ and $\tau_a$ are not close to each other; the larger time constant dominates. In other words, the sampler will faithfully sample a high-frequency RF signal to produce an equivalent-time signal if the highest frequency in $V_{IF}$ is less than $1/(2\pi \tau_{IF})$ This can also be expressed in terms of a IF rise time, $$t_{IF} = 2.2 \tau_{IF}.$$

This is the 10%-to-90% rise time (in real time, not equivalent-time) that would be observed on the IF output, if $V_{pc}$ contained a voltage step.

Designers of traditional high-frequency probes must go to great lengths to ensure repeatable contact parameters, since variations in contact pressures can greatly affect the contact resistance, and hence the measurement. The scanning force microscope, however, is a preferred tool for controlling contact pressure, so that repeatable contacts should be attainable. Furthermore, the scanning electrical sampler should be relatively insensitive to variations in contact pressure, since variations in contact resistance will only affect the RF charging time constant; the IF frequency can made low enough to circumvent this type of problem.

To summarize, suppose that we wish to measure a RF signal that has voltage edges of a certain speed. Our analysis has shown that both the RF and IF section impose speed limits on our sampling. The RF section converts $V_{RF}$ to $V_{pc}$ with a temporal resolution of $t_1$, and $V_{pc}$ is then converted into the equivalent-time signal $V_{IF}$, expanded in time by the ratio $f/\Delta f$. The IF rise time, $t_{IF}$, therefore corresponds to an equivalent RF rise time of $\Delta f\, t_{IF}/f$. We are free to set the offset frequency, $\Delta f$, to compensate for the effect of the IF rise time, by satisfying $$\Delta f < \frac{f}{t_{IF}} t_1.$$

(Note, however, that the timing jitter of the timebase used to drive the electronics places a lower limit on the frequency offset. Practically speaking, this is usually not a concern, since modern synthesizers can have sub-picosecond jitter over an interval of one second.) Therefore, the fundamental limit on the temporal resolution of the sampler is the one imposed by the sampling interval, $t_1$. Contrary to the conventional wisdom, the temporal resolution of the point-contact electrical sampler is not limited by the parasitic inductance of the ground connection. Using the same techniques that have reduced $t_1$ to sub-picosecond values, a scanning electrical sampler can be used to measure sub-picosecond and nanometer-scale signals.

Noise Performance

Figure 14:
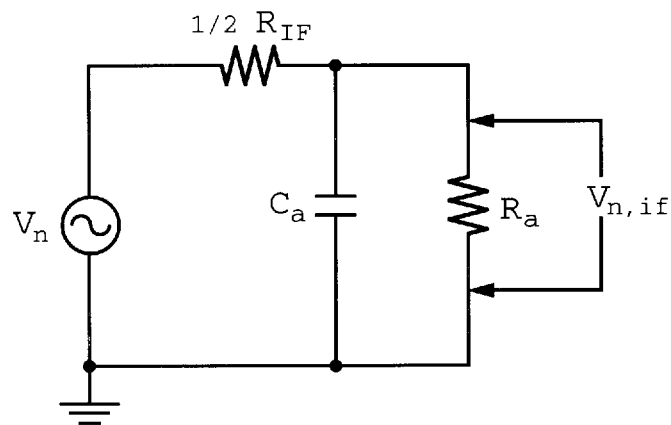
FIG. 14 is an equivalent circuit for a noise model of the probe.

We shall use a simple noise model, in which the noise on $V_{IF}$ is due to the Johnson-Nyquist noise from the resistors in the IF section of the sampler. (The resistors in the RF section are much smaller in value; in addition, the noise contributed by those resistors is reduced by the factor of the sampling pulse duty cycle, D.) The equivalent circuit for the noise model is shown in FIG. 14. The Johnson-Nyquist noise of the amplifier input resistance can be neglected since a much smaller resistance is in parallel with it. The Johnson-Nyquist noise due to the resistance $R_{IF}/2$ has spectral density $$V_n^2 = 2 k_B T R_{IF},$$

where $k_B$ is the Boltzmann constant and T is the absolute temperature. The noise voltage that this contributes to $V_{IF}$ rolls off with frequency precisely the same way that the signal voltage rolls off, since the same RC network is involved. The minimum detectable voltage at the RF input port, in a bandwidth B, is $$V_{min} = \sqrt{2 k_B T R_{IF} B}.$$

(Note that this is for positive bandwidth only; i.e., the factor of two due to positive and negative frequencies has already been included.) An interesting conclusion is that the minimum detectable voltage for the electrical sampler is independent of the sampling pulse duty cycle, $D=t_1/t_2$. This is because the noise on $V_{IF}$ is independent of the sampling pulse duty cycle, and the signal amplitude at the IF port is also independent of D, since the hold capacitor always charges fully to the piecewise constant signal voltage, as long as the offset frequency $\Delta f$ is made low enough to compensate for the slower IF rise time caused by a lower duty cycle. This breaks down, however, for duty cycles so low that the leakage current through $R_{IF}$ prevent $V_c$ from charging sufficiently close to $V_{pc}$.

Further Design Considerations

An ideal probing instrument makes its measurements while leaving the operation of the DUT circuit completely undisturbed. The scanning electrical sampler, not being an ideal instrument, loads the circuit under test. In practice, the bulk of the loading comes from the "DUT-to-sampler connection," which is everything between the DUT and the sampling diodes, including the SFM cantilever and any connecting wires. This is because that portion of the sampler is always electrically connected to the DUT, whereas the rest of the sampler is electrically connected only during the sampling interval, which cuts down the loading due to those portions by the factor of the sampling pulse duty cycle. The solution, therefore, is to place the sampling diodes as near the SFM tip as possible by monolithically integrating the two parts on the same substrate. For sub-picosecond temporal resolution, the LO sampling pulse generator should also be monolithically integrated.

Figure 15:
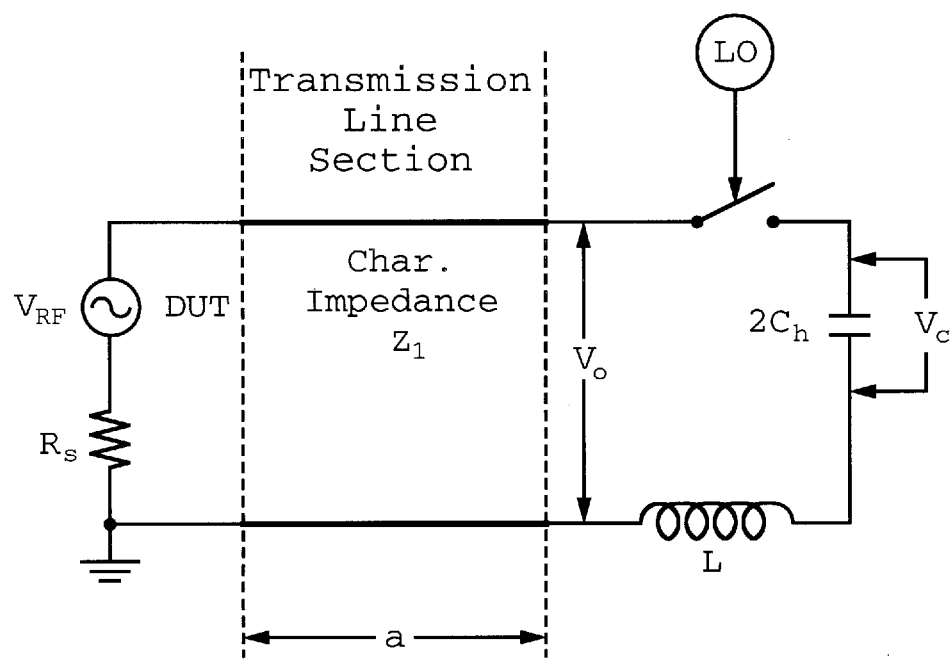
FIG. 15 is a circuit showing a model of the transmission line in the probe.
Figure 16:
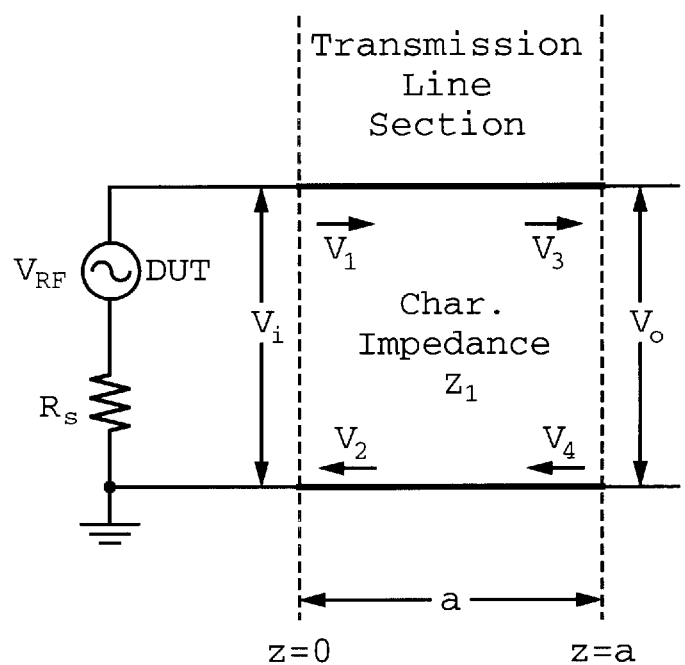
FIG. 16 is a circuit showing a model of the transmission line in the probe.

The importance of placing the sampling diodes near the test-point goes beyond minimizing circuit-loading; it is also vitally important in obtaining high temporal resolution. This does not seem obvious from an equivalent circuit such as the one in FIG. 12. Because the sampler is in series with the parasitic ground inductance, and order of connection does not matter in a series circuit, one might think that there could be an additional long wire between the sampling diodes and the DUT without affecting the temporal resolution, since that wire could be represented by a second inductor, which would simply add to the inductance of the original ground inductance. In fact, it is essential to the operation of the scanning electrical sampler to have an "electrically short" connection between the DUT and the sampling diodes. FIG. 12 is too simplified, and does not include the effect of a finite-length connection between the DUT and the sampler. The key lies in the fact that the connection has not only a distributed inductance, but also a distributed capacitance to ground; this is why it is not correct to treat the connection simply as an additional series inductance. We need to instead model it as a short section of transmission line; this is shown in FIG. 15. The transmission line has characteristic impedance $Z_1$ and length a. Since the sampling diodes are conducting for only a small fraction of the time, we neglect the effect of the sampling process on the transmission line, and assume that the voltage at the output of the transmission line, $V_o$, is the voltage that would be present if the transmission line were terminated in an open circuit. The situation is then that of FIG. 16. $V_1$ and $V_2$ are, respectively, the forward and reverse propagating voltage waves on the left end of the line; $V_3$ and $V_4$ are, respectively, the forward and reverse propagating voltage waves on the right end of the line. $V_i$ is the voltage across the left end of the line. The continuity of voltages at the boundaries yield $$V_i = V_1 + V_2$$

and $$V_o = V_3 + V_4.$$

The continuity of current on the left end yields $$\frac{(V_{RF} - V_i)}{R_s} = \frac{V_1 - V_2}{Z_1}.$$

The open circuit boundary condition on the right end yields $$V_3 - V_4 = 0.$$

Finally, the waves on the two ends of the line are related by $$V_3 = V_1 \gamma$$

and $$V_4 = \frac{V_2}{\gamma},$$

with $$\gamma = e^{i\omega a/c_0},$$

where $\omega$ is the frequency and $c_0$ is the propagation velocity. Solving these simultaneous equations yields $$V_o = \frac{2 V_{RF}}{\frac{1}{\gamma} + \gamma + \frac{R_s}{Z_1}\left(\frac{1}{\gamma} - \gamma\right)}.$$

Since $R_s << Z_1$ (the distributed capacitance to ground is small), we can simplify this to $$V_o = \frac{V_{RF}}{\cos(\omega a/c_0)}$$
$$= \frac{V_{RF}}{\cos(2\pi a/\lambda)}.$$

where $\lambda = 2\pi\, c_0/\omega$ is the wavelength of interest in the RF signal.

If the connection is "electrically long," i.e., a is not small compared to $\lambda$, then $V_o$ for a particular frequency will be highly frequency-dependent, producing severe distortions of $V_{RF}$. If, however, a<<$\lambda$, then the connection is "electrically short," and $V_o = V_{RF}$. The design rule, therefore, is to keep the length of the DUT-to-sampler connection short compared to the wavelength of the highest frequency of interest.

Operation

Figure 17:
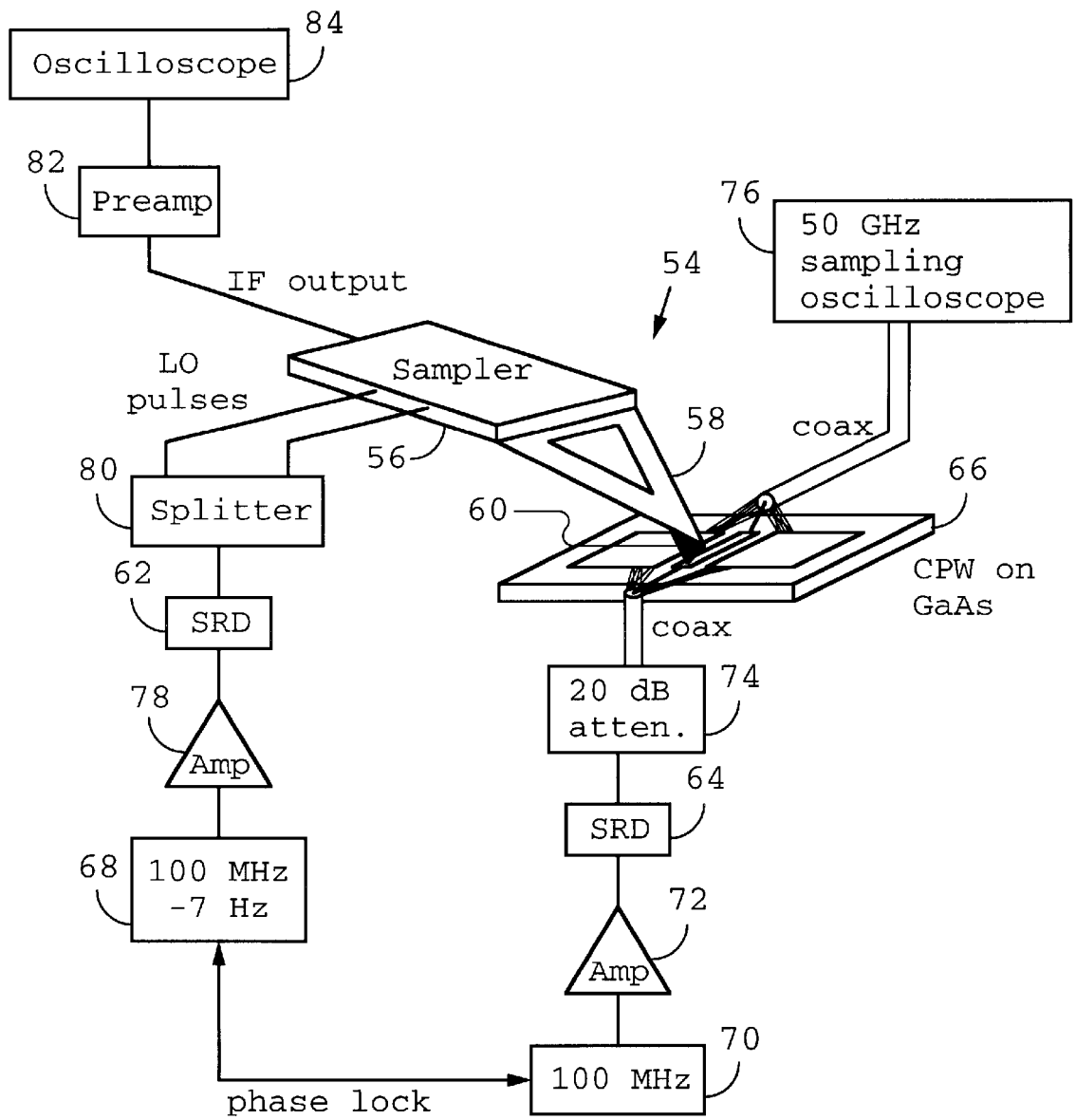
FIG. 17 is a block diagram showing a sampler of the invention as it may be used for testing.

As shown in FIG. 17, a scanning electrical sampler 54 according to the present invention is preferably monolithically integrated using techniques well known in the art. The electrical sampling circuit 56 is fabricated with a silicon scanning force microscope cantilever 58. A sputtered strip of gold, or other conductive material, along the cantilever (not shown) provides a conduction path from the circuit 56 to the tip 60. It should be noted that the use of an AFM tip permits the probe to be used for both electrical measurement and topographic imaging, allowing the tip to be precisely positioned on a very small circuit element of the DUT. Methods of cantilever deflection include, but are not limited to, optical beam bounce or piezoresistive techniques.

For simplicity, the sampler operation will be described in a testing mode in which it measures an artificially generated RF signal. Anyone skilled in the art will appreciate that the operation of the device in other contexts is obvious in view of the following.

Step-recovery diodes (SRD) 62 and 64, which take sine wave inputs and generate pulses (similar to a comb() function) that have pulse widths on the order of 100 picoseconds, were used to provide pulses for both the LO sampling pulses and the DUT RF signal. The DUT 66 was a through-line coplanar waveguide (CPW) transmission line fabricated on an alumina substrate. Two phase-locked synthesizers 68 and 70 were used as sources. The synthesizer 70 used for the RF signal was set to 100 MHz. The 100 MHz signal was amplified by amplifier 72, and then supplied to SRD 64, which converted the sine wave into a pulse train. The pulses were then fed through a 20 dB attenuator 74, to avoid overloading the sampler, and then supplied to the CPW line. The output of the CPW through-line was connected to a 50 GHz sampling oscilloscope 76 (e.g., an HP 70820A Microwave Transition Analyzer), so that any signals that are measured with the scanning electrical sampler can also be measured with the sampling oscilloscope for comparison. For the LO sampling pulses, the second synthesizer was set to 100 MHz–7 Hz; its output was amplified by amplifier 78, then converted to pulses using SRD 62, then supplied to a 3 dB splitter 80, which had its two outputs connected to the LO sampling pulse ports of the sampler. These two outputs had signal power reduced by 3 dB relative to the input, so that the total power was the same; more importantly, one output had the same polarity as the input, while the other output had the opposite polarity. We therefore obtained two synchronized pulses of opposite polarities, which was required by the sampler circuit. Finally, the IF output from the scanning electrical sampler was connected to a low-noise preamplifier 82, and the preamp output was connected to an oscilloscope 84.

At $\Delta f=100$ Hz the minimum detectable voltage is 800 nV/$\sqrt{\text{Hz}}$, which is a improvement of several orders of magnitude over presently existing high speed measurement techniques.

It will be clear to one skilled in the art that the above embodiment may be altered in many ways without departing from the scope of the invention. For example, the present invention does not depend on the use of an AFM tip, but may be adapted in obvious ways for use with any sharp tip to provide, for example, a very high speed hand-held probe. Alternatively, the AFM tip could be a scanning tunneling microscopy (STM) tip rather than an AFM tip. In view of the preceding description, these and many other variations will be obvious to anyone skilled in the art. Accordingly, the scope of the invention should be determined by the following claims and their legal equivalents.

What is claimed is:

1. A probe for sampling a radio frequency electrical signal having a wavelength $\lambda$ corresponding to a highest frequency component of interest, the probe comprising:

an electrically conductive probe tip for coupling to the electrical signal through a point contact with an electronic device under test;

an electrically-controlled sampling switch in electrical communication with the tip and positioned within a distance from the tip that is smaller than $\lambda$, wherein a first state of the switch permits the electrical signal to pass through the switch, wherein a second state of the switch does not permit the electrical signal to pass through the switch, wherein the first and second states of the switch are selected in response to an electrical control signal; and a local oscillator in electrical communication with the sampling switch, wherein the local oscillator generates the electrical control signal causing the sampling switch to change between the first and second states at radio frequencies, wherein the sampling switch produces an equivalent-time intermediate frequency signal representing the radio frequency electrical signal.

2. The probe of claim 1 wherein the sampling switch is a Schottky diode.

3. The probe of claim 1 wherein the distance from the tip is smaller than $\lambda/10$.

4. The probe of claim 1 wherein the distance from the tip is less than a centimeter.

5. The probe of claim 1 wherein the probe tip and the sampling switch are monolithically integrated.

6. The probe of claim 1 wherein the electrical control signal comprises two synchronized signals, wherein one of the two is the inverse of the other.

7. The probe of claim 1 further comprising an input capacitor electrically connected to the local oscillator.

8. The probe of claim 1 further comprising a hold capacitor electrically connected to the sampling switch.

9. The probe of claim 1 wherein the probe is adapted for use in atomic force microscopy.

* * * * *